(12) United States Patent
Chung et al.

(10) Patent No.: US 9,306,021 B2
(45) Date of Patent: Apr. 5, 2016

(54) GRAPHENE DEVICES AND METHODS OF FABRICATING THE SAME

(71) Applicant: Samsung Electronics Co., Ltd., Suwon-Si, Gyeonggi-Do (KR)

(72) Inventors: Hyun-jong Chung, Hwaseong-si (KR); David Seo, Yongin-si (KR); Seong-jun Park, Seoul (KR); Kyung-eun Byun, Uijeongbu-si (KR); Hyun-jae Song, Hwaseong-si (KR); Hee-jun Yang, Seoul (KR); Jin-seong Heo, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/244,223

(22) Filed: Apr. 3, 2014

(65) Prior Publication Data

US 2014/0299944 A1    Oct. 9, 2014

(30) Foreign Application Priority Data

Apr. 5, 2013   (KR) .................. 10-2013-0037664

(51) Int. Cl.
*H01L 29/02* (2006.01)
*H01L 29/47* (2006.01)
(Continued)

(52) U.S. Cl.
CPC ................ *H01L 29/47* (2013.01); *B82Y 10/00* (2013.01); *H01L 21/74* (2013.01); *H01L 29/0895* (2013.01); *H01L 29/165* (2013.01); *H01L 29/1606* (2013.01); *H01L 29/413* (2013.01); *H01L 29/66477* (2013.01);
(Continued)

(58) Field of Classification Search
CPC ................ H01L 29/47; H01L 29/7839; H01L 29/66477
USPC .......................................................... 257/402
See application file for complete search history.

(56) References Cited

U.S. PATENT DOCUMENTS 5,567,969 A * 10/1996 Hall ............................. 257/370
5,814,858 A *  9/1998 Williams ...................... 257/328
(Continued)

FOREIGN PATENT DOCUMENTS

EP           2525409 A1   11/2012
KR       20090123951 A   12/2009
(Continued)

OTHER PUBLICATIONS

Extended European Search Report dated Sep. 1, 2014 and issued in Application No. 14150529.7.
(Continued)

*Primary Examiner* — Phat X Cao
*Assistant Examiner* — Mohammad M Hoque
(74) *Attorney, Agent, or Firm* — Harness, Dickey & Pierce, P.L.C.

(57) ABSTRACT

A graphene device includes: a semiconductor substrate having a first region and a second region; a graphene layer on the first region, but not on the second region of the semiconductor substrate; a first electrode on a first portion of the graphene layer; a second electrode on a second portion of the graphene layer; an insulating layer between the graphene layer and the second electrode; and a third electrode on the second region of the semiconductor substrate. The semiconductor substrate has a tunable Schottky barrier formed by junction of the graphene layer and the semiconductor substrate.

27 Claims, 8 Drawing Sheets

(51) Int. Cl.

| | |
|---|---|
| *H01L 21/74* | (2006.01) |
| *H01L 29/778* | (2006.01) |
| *H01L 29/78* | (2006.01) |
| *H01L 29/16* | (2006.01) |
| *H01L 29/165* | (2006.01) |
| *H01L 29/41* | (2006.01) |
| *B82Y 10/00* | (2011.01) |
| *H01L 29/417* | (2006.01) |
| *H01L 29/66* | (2006.01) |
| *H01L 29/08* | (2006.01) |

(52) U.S. Cl.
CPC ....... *H01L 29/7781* (2013.01); *H01L 29/7839* (2013.01); *H01L 29/0847* (2013.01); *H01L 29/41725* (2013.01); *H01L 29/41766* (2013.01); *H01L 29/66977* (2013.01)

(56) References Cited

U.S. PATENT DOCUMENTS

| | | |
|---|---|---|
| 5,970,356 A | 10/1999 | Jeon |
| 6,909,143 B2 * | 6/2005 | Jeon et al. ................... 257/335 |
| 6,949,432 B2 | 9/2005 | Blanchard |
| 8,445,955 B2 * | 5/2013 | Cheng et al. ................. 257/329 |
| 2005/0095789 A1 * | 5/2005 | Blanchard ..................... 438/270 |
| 2009/0072241 A1 * | 3/2009 | Harris et al. ................... 257/77 |
| 2010/0032731 A1 * | 2/2010 | Babcock et al. .............. 257/280 |
| 2010/0258787 A1 * | 10/2010 | Chae et al. ..................... 257/39 |
| 2011/0215300 A1 * | 9/2011 | Guo et al. ....................... 257/29 |
| 2012/0032227 A1 * | 2/2012 | Seabaugh et al. ............ 257/105 |
| 2012/0181509 A1 * | 7/2012 | Liang et al. .................... 257/29 |
| 2013/0048951 A1 | 2/2013 | Heo et al. |
| 2013/0113081 A1 * | 5/2013 | Chen et al. ................... 257/602 |

FOREIGN PATENT DOCUMENTS

| | | |
|---|---|---|
| KR | 2010-0074442 A | 7/2010 |
| KR | 20110050621 A | 5/2011 |
| KR | 20120034419 A | 4/2012 |
| KR | 20130022852 A | 3/2013 |
| KR | 20130022854 A | 3/2013 |
| KR | 20130032105 A | 4/2013 |

OTHER PUBLICATIONS

Search Report for European Application No. 14 150 529.7 dated May 6, 2015.

* cited by examiner

GRAPHENE DEVICES AND METHODS OF FABRICATING THE SAME

CROSS-REFERENCE TO RELATED APPLICATIONS

This application claims priority under 35 U.S.C. §119 to Korean Patent Application No. 10-2013-0037664, filed on Apr. 5, 2013, in the Korean Intellectual Property Office, the disclosure of which is incorporated herein in its entirety by reference.

BACKGROUND

1. Field

Example embodiments relate to graphene devices and/or methods of fabricating the same, and more particularly, to graphene devices employing graphene Schottky diodes and/or methods of fabricating the same.

2. Description of the Related Art

Low-dimensional nanomaterials composed of carbon atoms include fullerene, carbon nanotubes, graphene, graphite, and the like. If the carbon atoms form a hexagonal arrangement and are ball-shaped, the carbon atoms may be classified a fullerene when a zero-dimensional structure, carbon nanotube when dried one-dimensionally, graphene when composed of one atomic layer two-dimensionally, and graphite when stacked three-dimensionally. Graphene has relatively stable and superior electrical/mechanical/chemical characteristics as well as excellent conductivity.

SUMMARY

Some example embodiments provide graphene devices having graphene Schottky diode structures and/or methods of fabricating the same.

Additional aspects will be set forth in part in the description which follows and, in part, will be apparent from the description, or may be learned by practice of example embodiments.

At least one example embodiment provides a graphene device including: a semiconductor substrate; a graphene layer on a first region of the semiconductor substrate; a first electrode on a first portion of the graphene layer; a second electrode on a second portion of the graphene layer; an insulating layer between the graphene layer and the second electrode; and a third electrode on a second region of the semiconductor substrate in which no graphene layer is formed. The semiconductor substrate has a tunable Schottky barrier formed by junction of the graphene layer and the semiconductor substrate.

At least one other example embodiment provides a graphene device including: a semiconductor substrate having a first region and a second region; a graphene layer on the first region, but not on the second region of the semiconductor substrate; a first electrode on a first portion of the graphene layer; a second electrode on a second portion of the graphene layer; an insulating layer between the graphene layer and the second electrode; and a third electrode on the second region of the semiconductor substrate. The semiconductor substrate has a tunable Schottky barrier formed by junction of the graphene layer and the semiconductor substrate.

The graphene layer may directly contact the semiconductor substrate. The first electrode may directly contact the graphene layer.

A surface of the region of the semiconductor substrate on which the graphene layer is formed may be flat or substantially flat. Alternatively, the surface of the region of the semiconductor substrate on which the graphene is formed may be planar or substantially planar.

The first electrode may be a source electrode, the second electrode may be a gate electrode, and the third electrode may be a drain electrode.

The semiconductor substrate may have a carrier concentration of between about $10^{15}$ about $10^{17}$ cm$^{-1}$, inclusive.

According to at least some example embodiments, the graphene device may further include: a high-concentration doped region in the semiconductor substrate, the high-concentration doped region being doped with impurities having a higher carrier concentration than a carrier concentration of the semiconductor substrate.

The high-concentration doped region may be in a lower part of the second region of the semiconductor substrate and in a third region of the semiconductor substrate between the first and second regions. The high-concentration doped region may have a carrier concentration of between about $10^{18}$ and about $10^{20}$ cm$^{-1}$, inclusive.

A conductivity type of the impurity doped into the semiconductor substrate and a conductivity type of the impurity doped into the high-concentration doped region may be the same.

The third electrode may electrically contact the high-concentration doped region through a hole in the third region of the semiconductor substrate.

An upper surface of the high-concentration doped region may be exposed and electrically contact the third electrode.

The first electrode may include at least one of gold, nickel, platinum, aluminum, and chromium. The second and third electrodes may include metal or polysilicon. The semiconductor substrate may be formed of one of silicon, germanium, silicon-germanium, III-V-group semiconductor, and II-VI-group semiconductor.

The Schottky barrier of the semiconductor substrate may vary according to a voltage applied to the second electrode. The Schottky barrier of the semiconductor substrate may decrease when voltage is applied to the second electrode.

At least one other example embodiment provides a graphene device including: a semiconductor substrate; a graphene layer directly on a first region of the semiconductor substrate; a first electrode on a first portion of the graphene layer, a junction between the graphene layer and the semiconductor substrate forming a Schottky barrier of the semiconductor substrate; a second electrode on a second portion of the graphene layer; an insulating layer between the graphene layer and the second electrode; and a third electrode on a second region of the semiconductor substrate.

At least one other example embodiment provides a graphene device including: a semiconductor substrate; a graphene layer on a flat surface of a first region of the semiconductor substrate; a first electrode on a first portion of the graphene layer, a junction between the graphene layer and the semiconductor substrate forming a Schottky barrier of the semiconductor substrate; a second electrode on a second portion of the graphene layer; an insulating layer between the graphene layer and the second electrode; and a third electrode on a second region of the semiconductor substrate.

According to at least some example embodiments, the first electrode may directly contact the graphene layer. A surface of the first region of the semiconductor substrate may be flat. The Schottky barrier may be a tunable Schottky barrier. The Schottky barrier may vary according to a voltage applied to the second electrode. The third electrode may be on the second region without an intervening graphene layer.

The graphene device may further include: a high-concentration doped region in the semiconductor substrate, the high-concentration doped region being doped with impurities having a higher carrier concentration than a carrier concentration of the semiconductor substrate.

At least one other example embodiment provides a method of fabricating a graphene device, including: forming a graphene layer on first and second regions of a semiconductor substrate; forming a metal layer on the graphene layer; forming a third electrode on a third region of the semiconductor substrate without an intervening graphene layer between the third electrode and the third region of the semiconductor substrate; forming a first electrode by removing the metal layer from the second region of the semiconductor substrate to expose the graphene layer on the second region of the semiconductor substrate; forming a gate insulating layer on the semiconductor substrate, the metal layer, the graphene layer, the first electrode, and the third electrode; forming a second electrode on the gate insulating layer between the first electrode and the third electrode; and forming holes through the gate insulating layer to expose upper portions of the first electrode and the third electrode.

According to at least some example embodiments, the method may further include: forming a high-concentration doped region in the second and third regions of the semiconductor substrate. The forming the high-concentration doped region may include: doping an impurity having a higher carrier concentration than a carrier concentration of other portions of the semiconductor substrate into the second and third regions of the semiconductor substrate. The impurity doped into the second and third regions of the semiconductor substrate may be of the same type as the impurity doped into the other portions of the semiconductor substrate.

According to at least some example embodiments, the method may further include: forming, before forming the third electrode, a hole through the third region of the semiconductor substrate to expose the high-concentration doped region.

The first electrode may include at least one of gold, nickel, platinum, aluminum, and chromium.

A graphene transistor according to one or more example embodiments may be directly grown or transferred on a flat surface by removing (or alternatively omitting) the insulating layer (e.g., an oxidized layer) of the source electrode (or the drain electrode). Also, the graphene transistor according to one or more example embodiments may reduce resistance of a carrier that flows into the conventional semiconductor substrate (for example, a silicon substrate) by forming the high-concentration doped region inside the semiconductor substrate.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
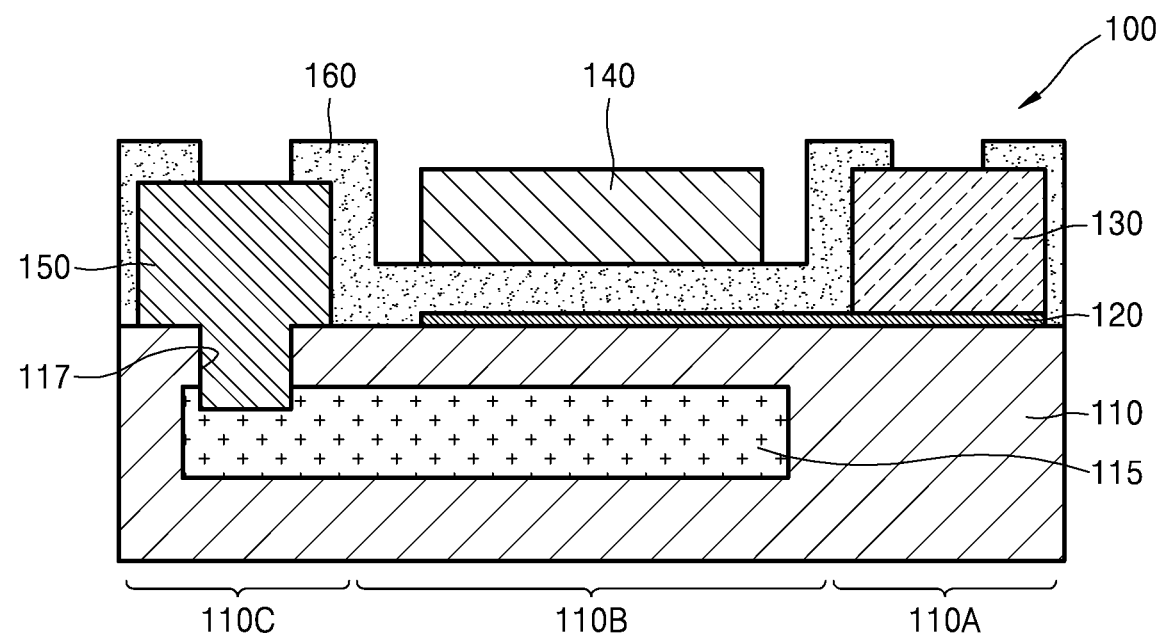
FIG. 1 is a view illustrating a graphene transistor according to an example embodiment.

Example embodiments will now be described more fully with reference to the accompanying drawings, in which some example embodiments are shown. In the drawings, the thicknesses of layers and regions are exaggerated for clarity. Like reference numerals in the drawings denote like elements.

Detailed illustrative embodiments are disclosed herein. However, specific structural and functional details disclosed herein are merely representative for purposes of describing example embodiments. Example embodiments may be embodied in many alternate forms and should not be construed as limited to only those set forth herein.

It should be understood, however, that there is no intent to limit this disclosure to the particular example embodiments disclosed. On the contrary, example embodiments are to cover all modifications, equivalents, and alternatives falling within the scope of this disclosure. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of this disclosure. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Various example embodiments will now be described more fully with reference to the accompanying drawings in which some example embodiments are shown. In the drawings, the thicknesses of layers and regions are exaggerated for clarity.

Graphene is a material composed of a plurality of carbon atoms connected to each other by covalent bond, wherein the plurality of carbon atoms constitute polycyclic aromatic molecules. The carbon atoms connected by covalent bonds constitute a 6-membered ring as a basic repetition unit, but further include a 5-membered ring and/or 7-membered ring. As a result, graphene comes in sight as a single layer of covalent-bonded carbon atoms (generally, $sp^2$-bond). The term "graphene" used herein comprehensively refers to single-layer graphene and a multi-layer graphene structure. Such graphene may be fabricated by methods according to the related art. For example, graphene may be fabricated by fabricating a graphene sheet and then transferring the graphene sheet onto a substrate, or by directly growing graphene on the substrate.

FIG. 1 illustrates a graphene transistor 100 according to an example embodiment.

Referring to FIG. 1, the graphene transistor 100 includes a semiconductor substrate 110. The semiconductor substrate 110 has a first region 110A, a second region 110B and a third region 110C. A graphene layer 120 is formed on an upper surface of the semiconductor substrate 110 in the first region 110A and the second region 110B, and constitutes a graphene Schottky diode structure. In this case, the second region 110B corresponds to a channel region of the semiconductor substrate 110.

The upper surface of the semiconductor substrate 110 in at least the first region 110A and the second region 110B may be flat or substantially flat (or alternatively planar or substantially planar). In a graphene transistor according to the related art, an insulating layer of a source electrode (or a drain electrode) is interposed between a semiconductor substrate and graphene, which results in a step difference at an end of the insulating layer of the source electrode (or the drain electrode). As a result, it is relatively difficult to transfer or directly grow graphene at the end of the insulating layer of the source electrode (or the drain electrode).

The graphene transistor 100 shown in FIG. 1 includes a first electrode 130 formed of metal, such as gold (Au), nickel (Ni), platinum (Pt), aluminum (Al), chromium (Cr), etc., which allows the insulating layer of the source electrode (or the drain electrode) according to the related art to be omitted. As a result, the surface of the semiconductor substrate 110 on which the graphene layer 120 is to be formed may be flat or substantially flat, and thus, it is relatively easy to transfer or directly grow graphene.

Still referring to FIG. 1, the semiconductor substrate 110 may be formed of one of silicon, germanium, silicon-germanium, III-V-group semiconductor, and II-VI-group semiconductor. The semiconductor substrate 110 may be doped with an impurity, and may serve as a back gate of the grapheme transistor 100. The impurity doped into the semiconductor substrate 110 may be an n-type or p-type dopant. The semiconductor substrate 110 may be an n-type silicon substrate or a p-type silicon substrate, for example. In at least one example embodiment, a carrier concentration of the semiconductor substrate 110 may be between about $10^{15}$ and about $10^{17}$ $cm^{-1}$, inclusive.

The semiconductor substrate 110 may include a high-concentration doped region (also referred to as high-concentration doped region) 115. In this example embodiment, the high-concentration doped region 115 may be doped with an impurity having relatively high concentration, and may be formed inside the semiconductor substrate 110. A dopant doped into the high-concentration doped region 115 may be an n-type or p-type dopant and may be the same or substantially the same type as the dopant doped into the semiconductor substrate 110. The high-concentration doped region 115 may be positioned in a lower portion of the second region 110B and the third region 110C.

In the example embodiment shown in FIG. 1, the high-concentration doped region 115 extends from a lower portion of a third electrode 150 to a lower portion of a second electrode 140 that is a channel region. That is, for example, the high-concentration doped region 115 vertically underlaps (or overlaps below) the lower portion of the third electrode 150 as well as the second electrode 140. In at least one example embodiment, a carrier concentration of the high-concentration doped region 115 may be between about $10^{18}$ and about $10^{20}$ $cm^{-1}$, inclusive. The high-concentration doped region 115 may reduce resistance of carriers that flow into the semiconductor substrate 110.

The graphene layer 120 may be formed by transferring graphene fabricated by chemical vapor deposition (CVD) onto the semiconductor substrate 110 and then by patterning graphene. Alternative, the graphene layer 120 may be directly formed on the semiconductor substrate 110. The graphene layer 120 may include one or more layers of graphene. In one example, the graphene layer 120 may include 1 to four layers of graphene. The graphene layer 120 functions as a path through which carriers move. A band gap of the graphene layer 120 may be about zero.

Still referring to FIG. 1, the graphene transistor includes a first electrode 130 on the graphene layer 120 in the first region 110A of the substrate 110. The first electrode 130 may be formed of metal. For example, the first electrode 130 may be formed of at least one metal selected from the group including gold (Au), nickel (Ni), platinum (Pt), aluminum (Al), chromium (Cr), alloys thereof or the like. No other layers may be interposed between the graphene layer 120 and the first electrode 130, and the first electrode 130 may directly contact the graphene layer 120. That is, for example, the first electrode 130 may be formed directly on the graphene layer 120 in the first region 110A of the substrate 110. A gap may be formed between the graphene layer 120 and the first electrode 130, and the semiconductor substrate 110 has a Schottky barrier formed by junction of (between) the graphene layer 120 and the semiconductor substrate 110. In one example, as discussed below the Schottky barrier is a tunable barrier that varies according to a voltage applied to the second electrode 140.

The second electrode 140 is formed on the graphene layer 120 in the second region 110B of the substrate 110. The third electrode 150 is formed on the semiconductor substrate 110 in the third region 110C. As shown in FIG. 1, the third electrode 150 is formed on the substrate 110 in a region in which no graphene layer 120 is formed. The third electrode 150 electrically contacts (e.g., directly) the high-concentration doped region 115 via a hole 117 through the substrate 110 in the third region 110C of the semiconductor substrate 110. In this example, the third electrode 150 is formed on the top surface of the semiconductor substrate 110 and fills the hole 117 such that the third electrode 150 directly contacts the high-concentration doped region 115. The second electrode 140 and the third electrode 150 may be formed of metal or polysilicon.

A gate insulating layer 160 is interposed between the graphene layer 120 and the second electrode 140. The gate insulating layer 160 may be formed of silicon oxide, silicon nitride, or the like.

In the example embodiment shown in FIG. 1, the first electrode 130 may be a source electrode, the second electrode 140 may be a gate electrode, and the third electrode 150 may be a drain electrode.

Figure 2A:
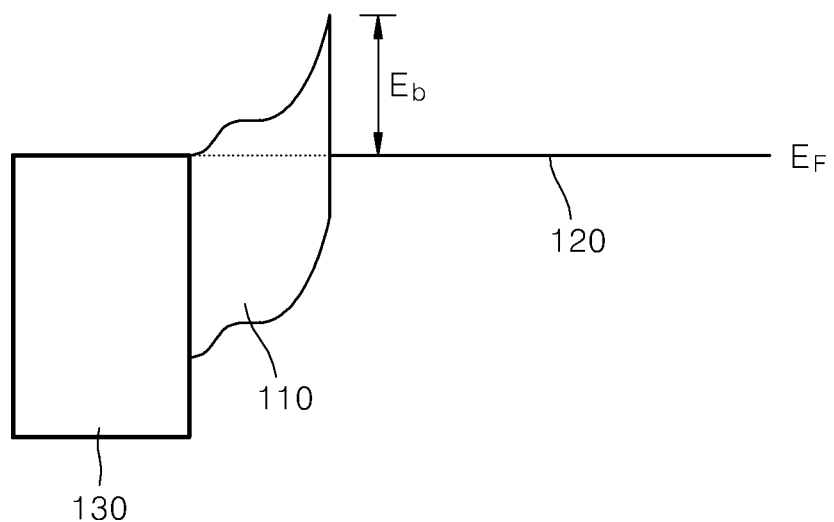
FIGS. 2A and 2B are energy band diagrams for explaining example operation of the graphene transistor illustrated in FIG. 1.
Figure 2B:
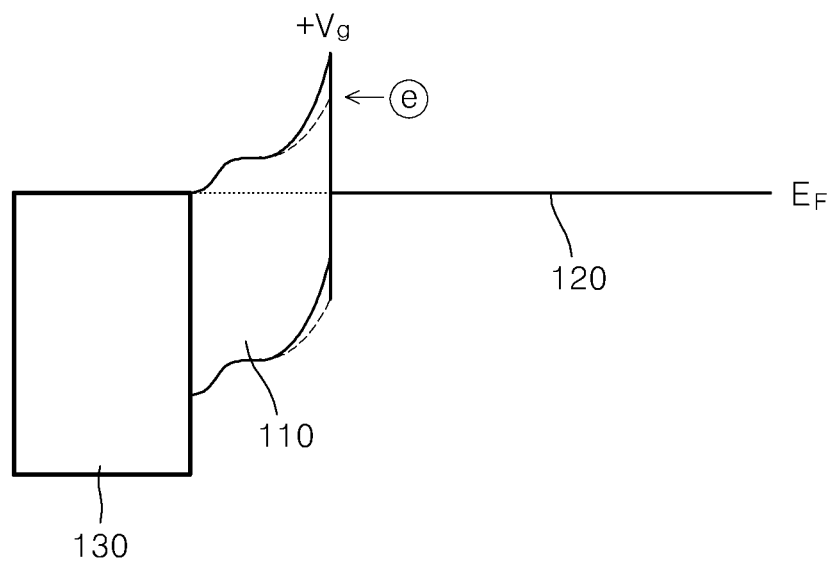

FIGS. 2A and 2B are energy band diagrams for explaining example operation of the graphene Schottky diode illustrated in FIG. 1. FIG. 2A illustrates a state before a gate voltage is applied, and FIG. 2B illustrates a state after application of the gate voltage. Hereinafter, the semiconductor substrate 110 will be described as an n-type semiconductor substrate doped with an n-type impurity.

Referring to FIGS. 1 and 2A, in a state in which no gate voltage is applied to the second electrode 140, an energy band structure is formed on a junction surface of the semiconductor substrate 110 and the graphene layer 120 and on a junction surface of the semiconductor substrate 110 and the third electrode 150 according to each work function. Because the graphene transistor 100 includes the n-type semiconductor substrate 110, the main carrier is electrons. Movement of the carrier is limited by an energy barrier $E_b$ between the graphene layer 120 and the semiconductor substrate 110. In FIGS. 2A and 2B, $E_F$ represents a Fermi energy level of the graphene layer 120.

Referring to FIGS. 1 and 2B, in a state in which a given (or alternatively predetermined) voltage is applied to the first electrode 130 and the third electrode 150, if a given (or alternatively predetermined) positive gate voltage $+V_g$ is applied to the second electrode 140, a work function of the graphene layer 120 varies such that the energy barrier $E_b$ between the graphene layer 120 and the semiconductor substrate 110 decreases, as indicated by the dotted line in FIG. 2B. Thus, electrons move more easily from the graphene layer 120 to the third electrode 150. As a result, current flows through the graphene transistor 100 in response to the gate voltage. In this case, the graphene transistor 100 may serve as a switching device. That is, the graphene layer 120 serves as a carrier path, a work function of which varies according to the gate voltage.

The energy barrier $E_b$ in FIG. 2A represents the energy barrier of the portion of the semiconductor substrate 110 between the graphene layer 120 and the third electrode 150. If the energy barrier $E_b$ decreases, the electrons may pass through the semiconductor substrate 110 more easily by a tunneling effect through the semiconductor substrate 110.

As the gate voltage increases, the energy barrier $E_b$ between the graphene layer 120 and the semiconductor substrate 110 further decreases. That is, for example, the energy barrier $E_b$ between the graphene layer 120 and the semiconductor substrate 110 may be adjusted by applying different gate voltages to the second electrode 140.

The energy barrier $E_b$ between the graphene layer 120 and the semiconductor substrate 110 may also vary according to a material of the first electrode 130. Thus, if metal that allows the energy barrier $E_b$ between the graphene layer 120 and the semiconductor substrate 110 in a state in which a gate voltage is applied (e.g., when the graphene transistor 100 is turned on) to be greater than the energy barrier $E_b$ in a state in which no gate voltage is applied (e.g., when the graphene transistor 100 is turned off) is applied to the first electrode 130, even when no insulating layer of the source electrode (or drain electrode) is disposed between the semiconductor substrate 110 and the graphene layer 120, the energy barrier $E_b$ between the graphene layer 120 and the semiconductor substrate 110 may serve as an insulating layer barrier.

In the graphene transistor 100 according to at least this example embodiment, the first electrode 130 may be formed of metal, such as gold (Au), nickel (Ni), platinum (Pt), aluminum (Al), chromium (Cr), an alloy thereof or the like, such that the barrier between the semiconductor substrate 110 and the graphene layer 120 in the junction between the semiconductor substrate 110 and the graphene layer 120 when the graphene transistor 100 is turned on may be larger than the same barrier when the graphene transistor 100 is turned off. Thus, the same or substantially the same effect as a barrier caused by the insulating layer of the source electrode (or drain electrode) according to the related art is shown so that, in at least this example embodiment, the insulating layer of the source electrode (or drain electrode) according to the related art may be removed. Accordingly, the first and second regions 110A and 110B of the semiconductor substrate 110 on which the graphene layer 120 is formed may be overall flat or substantially flat.

In a conventional graphene switching device, an insulating layer is interposed in Schottky junction. As a result, directly growing or transferring graphene is more difficult due to a stepped structure caused by the insulating layer. On the other hand, according to at least some example embodiments, the first and second regions 110A and 110B of the semiconductor substrate 110 on which the graphene layer 120 is formed are flat or substantially flat, and thus, transferring or directly growing the graphene layer 120 may be easier.

Although an n-type transistor as an n-type semiconductor substrate doped with an n-type impurity has been described, it would be obvious to one of ordinary skill in the art that a p-type transistor in which a p-type impurity is doped into the semiconductor substrate 110 may also be used.

Figure 3:
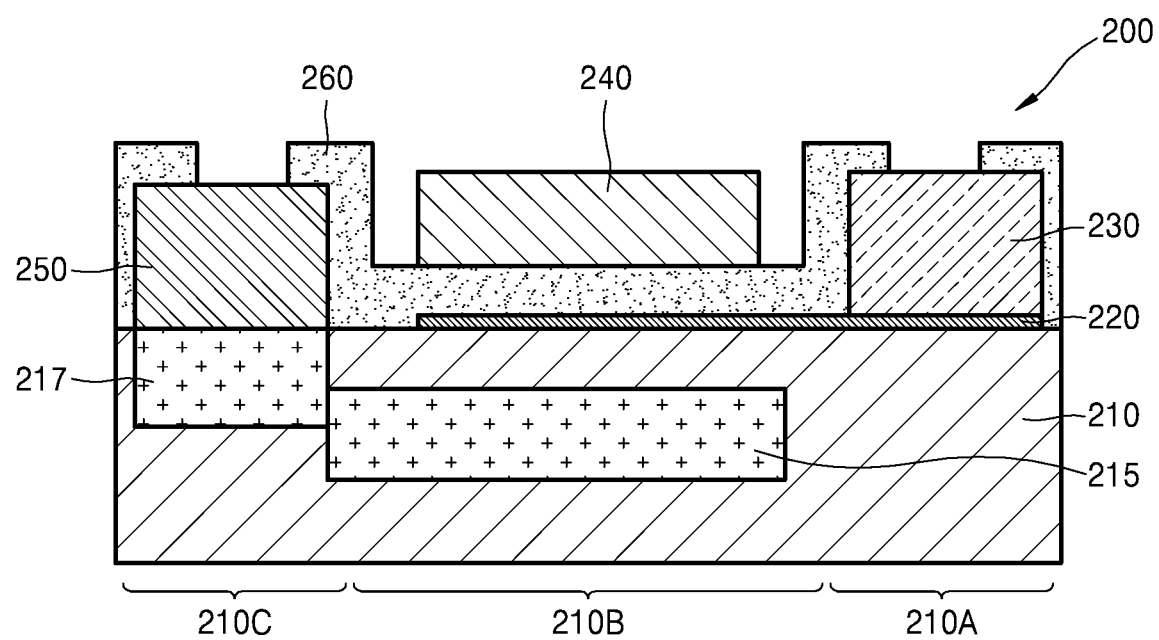
FIG. 3 is a view illustrating a graphene transistor according to another example embodiment.

FIG. 3 illustrates a graphene transistor 200 according to another example embodiment. The graphene transistor 200 is similar to or substantially the same as the graphene transistor 100 illustrated in FIG. 1 except with regard to the structure of high-concentration doped regions 215 and 217 inside a semiconductor substrate 210 and a third electrode 250 that contacts the high-concentration doped regions 215 and 217.

Referring to FIG. 3 in more detail, the graphene transistor 200 includes the semiconductor substrate 210, a graphene layer 220, first through third electrodes 230, 240, and 250, and a gate insulating layer 260. In this case, the semiconductor substrate 210, the graphene layer 220, the first and third electrodes 230 and 250, and the gate insulating layer 260 are the same or substantially the same as the semiconductor substrate 110, the graphene layer 120, the first and third electrodes 130 and 150, and the gate insulating layer 160, respectively, illustrated in FIG. 1. A detailed discussion of materials and functions of the second electrode 240 and the high-concentration doped regions 215 and 217 that are the same or substantially the same as the second electrode 140 and the high-concentration doped region 115, respectively, illustrated in FIG. 1 will be omitted.

The high-concentration doped regions 215 and 217 doped with impurities having relatively high concentration are formed inside the semiconductor substrate 210. When a top surface of the semiconductor substrate 210 includes a first region 210A corresponding to the first electrode 230, a second region 210B corresponding to the second electrode 240 and a third region 210C corresponding to the third electrode 250, the first high-concentration doped region 215 is formed in the second region 210B (e.g., in a channel region of the semiconductor substrate 210) to reduce a resistance of a carrier that flows into the semiconductor substrate 210. The second high-concentration doped region 217 may extend from the first high-concentration doped region 215 to the third region 210C of the semiconductor substrate 210 (e.g., to a lower region of the third electrode 250) and may be exposed to the top surface of the semiconductor substrate 210. In the example embodiment shown in FIG. 3, the second high-concentration doped region 217 is formed below the third electrode 250. Thus, unlike the example embodiment shown in FIG. 1, a hole through the substrate 210 is not required for electrical contact between the third electrode 250 and the second high-concentration doped region 217. Yet, the third electrode 250 still directly electrically contacts the second high-concentration doped region 217.

FIGS. 4A through 4G illustrate a method of fabricating a graphene transistor according to an example embodiment. The fabrication method according to at least this example embodiment may be understood as a fabrication method of the graphene transistor 100 illustrated in FIG. 1.

Figure 4A:
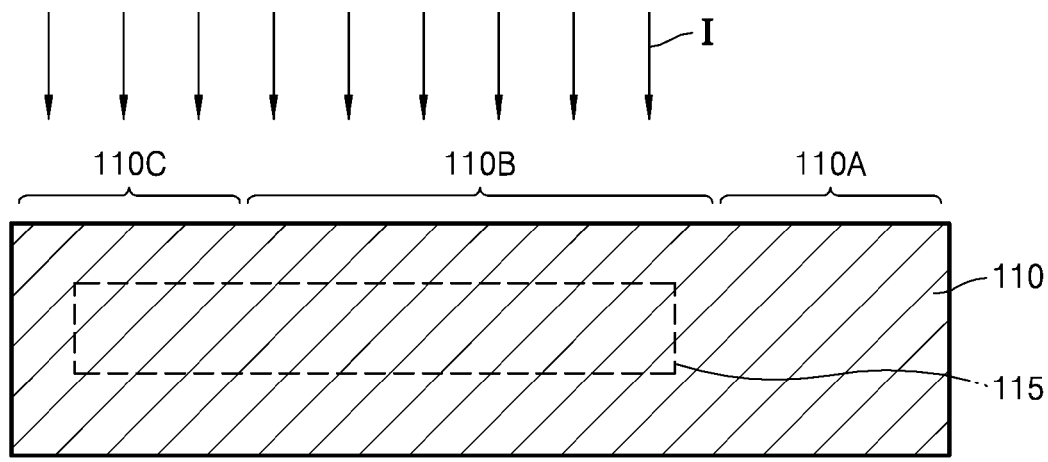
FIGS. 4A through 4G illustrate a method of fabricating a graphene transistor according to an example embodiment.
Figure 4B:
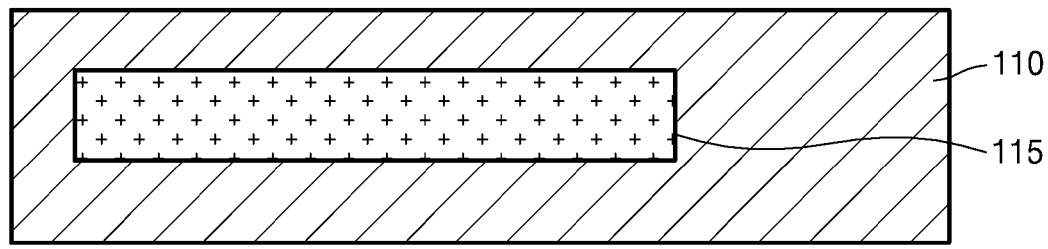

Referring to FIG. 4A, a semiconductor substrate 110 is prepared. The semiconductor substrate 110 may be a silicon substrate. Of course, the semiconductor substrate 110 may be formed of germanium, silicon-germanium, III-V-group semiconductor, or II-VI-group semiconductor. As shown in FIG. 4A, a top surface of the semiconductor substrate 110 is divided into a first region 110A, a second region 110B and a third region 110C. Ion implantation and annealing processes are performed on the second and third regions 110B and 110C of the semiconductor substrate 110, thereby forming a high-concentration doped region 115 having a carrier concentration of the semiconductor substrate 110 of between about $10^{18}$ and about $10^{20}$ cm$^{-1}$, inclusive. In this case, the ion implantation process may be performed as a deep implantation process so that the high-concentration doped region 115 may be formed inside the semiconductor substrate 110, as illustrated in FIG. 4B.

Figure 4C:
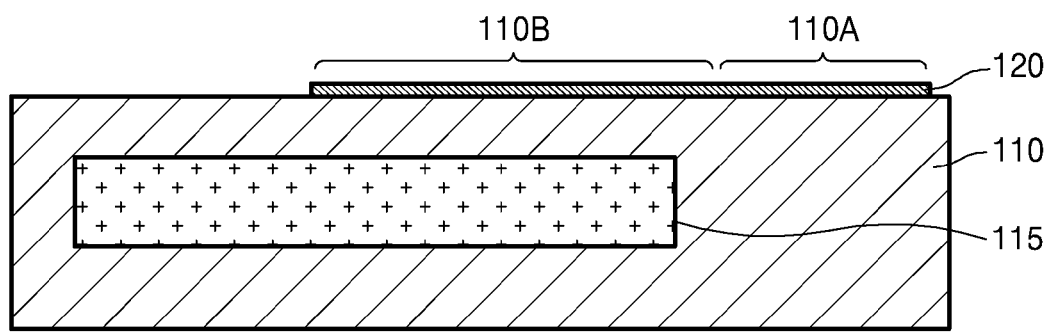

Referring to FIG. 4C, graphene is transferred onto the first and second regions 110A and 110B of the semiconductor substrate 110 to form a graphene layer 120. Fabrication and transfer methods of graphene may use well-known methods. Alternatively, the graphene layer 120 may be directly grown on the semiconductor substrate 110.

Figure 4D:
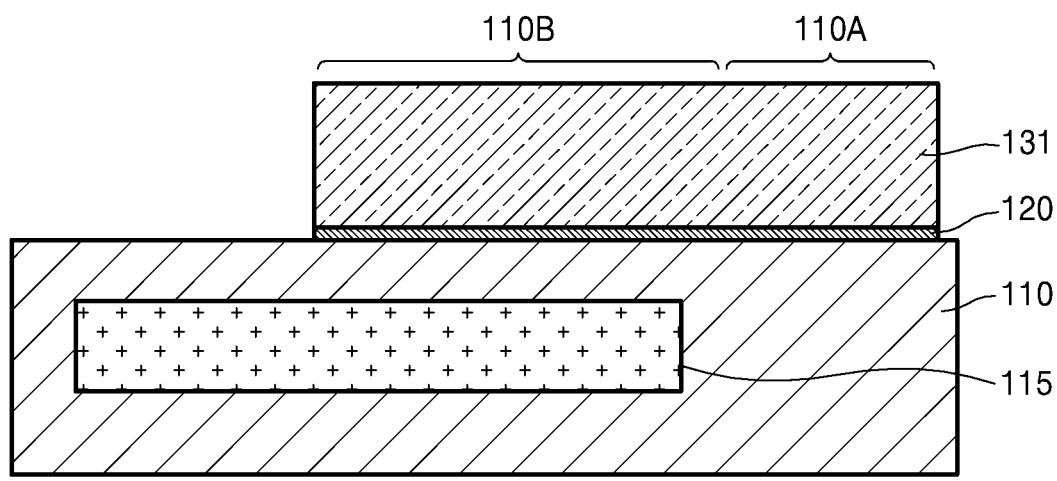

Referring to FIG. 4D, a metal layer 131 is formed on the graphene layer 120. The metal layer 131 may be formed by depositing metal, such as Au, Ni, Pt, Al, Cr, alloys thereof or the like.

Figure 4E:
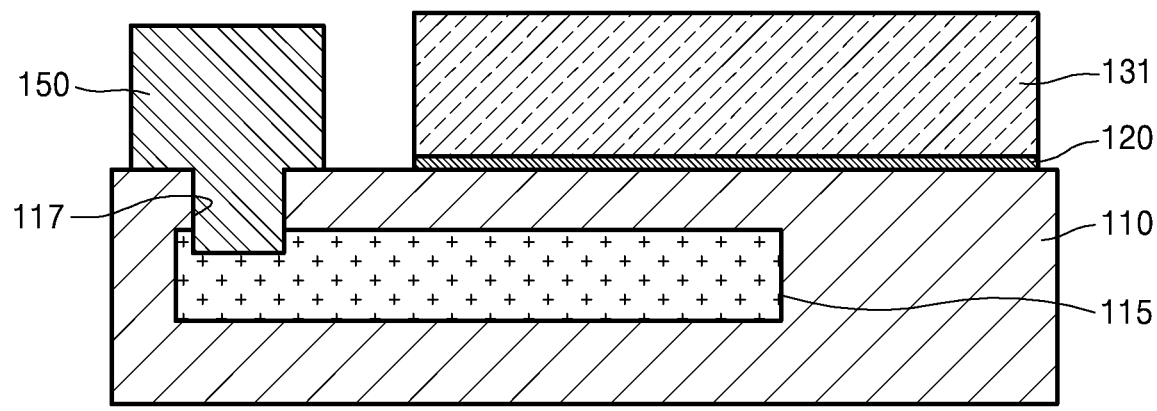

Referring to FIG. 4E, a hole 117 is formed through the semiconductor substrate 110 in the third region 110C to expose the high-concentration doped region 115, and a third electrode 150 is formed to fill the hole 117 and on an upper surface of the semiconductor substrate 110 in the third region 110C. The hole 117 may be formed by forming a pattern on the semiconductor substrate 110 using photolithography and dry etching the semiconductor substrate 110. The third electrode 150 may be formed by depositing metal or polysilicon.

Figure 4F:
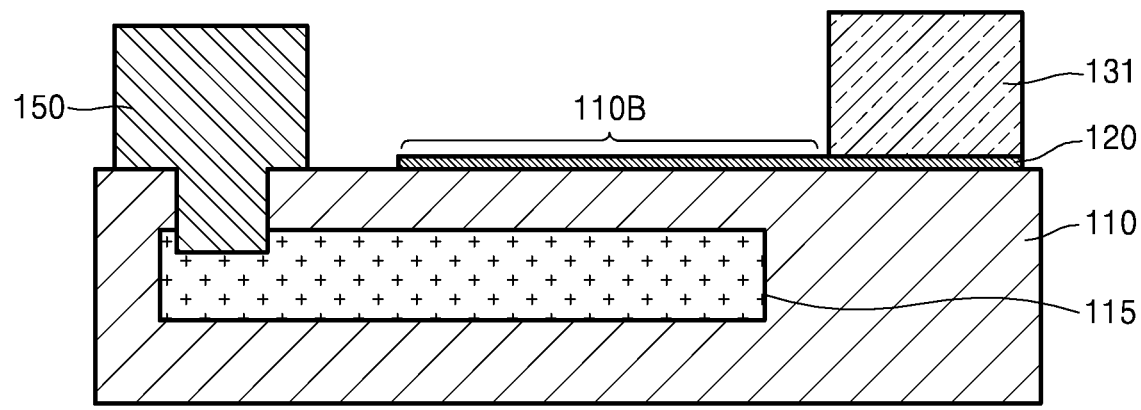

Referring to FIG. 4F, the portion of the metal layer 131 in the second region 110B is removed to expose the graphene layer 120 in the second region 110B. The portion of the metal layer 131 remaining in the first region 110A is the first electrode (see 130 of FIG. 1).

Figure 4G:
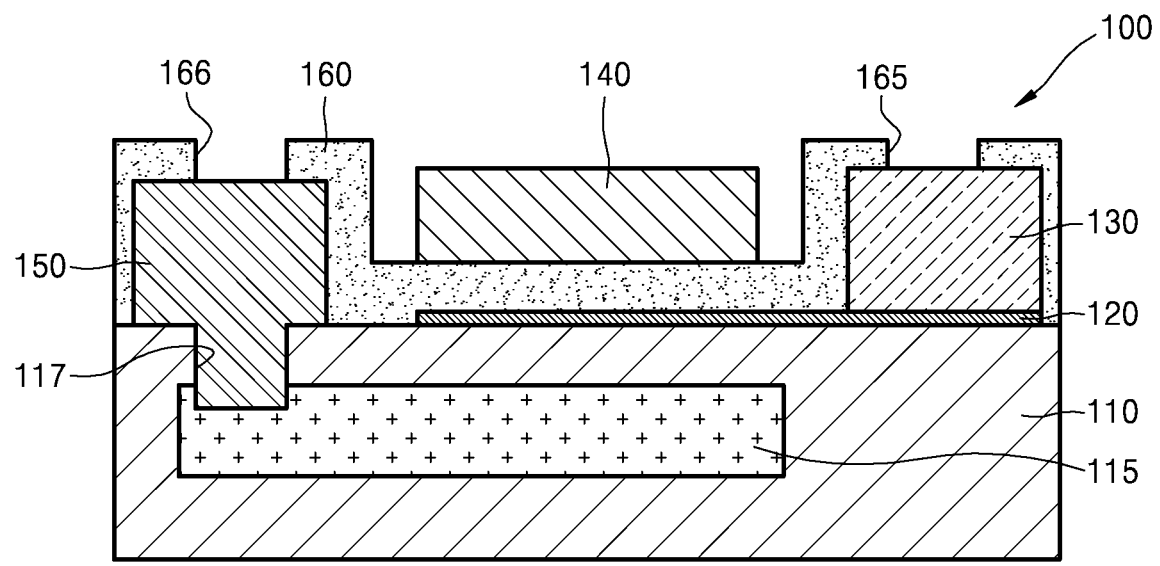

Referring to FIG. 4G, a gate insulating layer 160 is formed on the top surface of the semiconductor substrate 110 including the metal layer 131, the graphene layer 120, and the third electrode 150. The second electrode 140 is formed on the gate insulating layer 160 between the first electrode 130 and the third electrode 150. Portions of the gate insulating layer 160 corresponding to upper parts of the first electrode 130 and the third electrode 150 are then etched to form holes 165 and 166 exposing upper parts of the first electrode 130 and the third electrode 150.

FIGS. 5A through 5F illustrate a method of fabricating a graphene transistor according to another example embodiment. The fabrication method according to at least this example embodiment may be understood as a fabrication method of the graphene transistor 200 illustrated in FIG. 3.

Figure 5A:
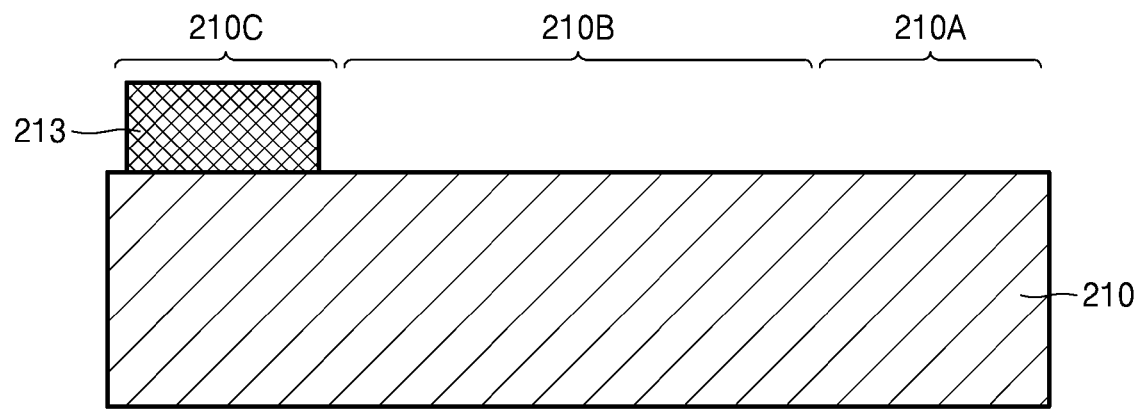
FIGS. 5A through 5F illustrate a method of fabricating a graphene transistor according to another example embodiment.

Referring to FIG. 5A, a semiconductor substrate 210 may be a silicon substrate. A top surface of the semiconductor substrate 210 is divided into a first region 210A, a second region 210B and a third region 210C, and a silicon oxide layer 213 is formed in the third region 210C of the semiconductor substrate 210. In one example, after a silicon oxide layer is formed on the entire top surface of the semiconductor substrate 210, the silicon oxide layer in regions other than the third region 210C is removed to form the silicon oxide layer 213 in the third region 210C.

Figure 5B:
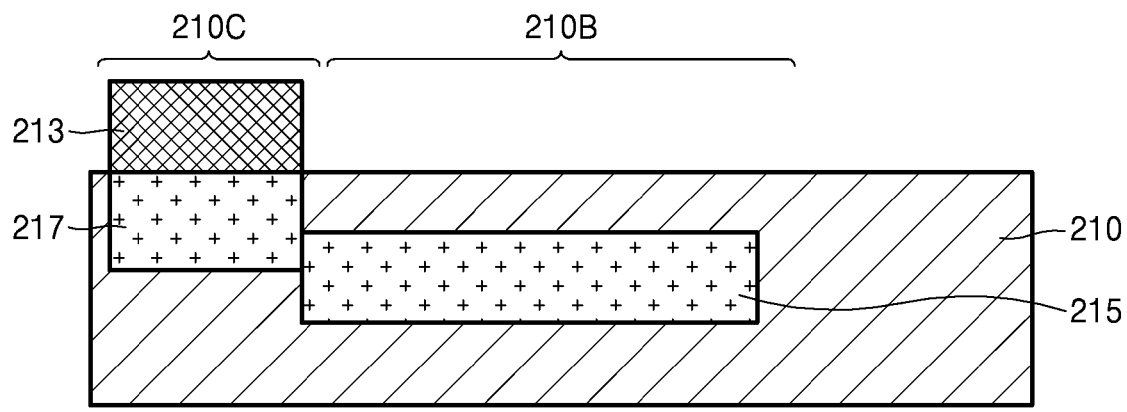

Referring to FIG. 5B, deep ion implantation and annealing processes are performed on the second and third regions 210B and 210C of the semiconductor substrate 210. In this example, the thickness of the silicon oxide layer 213 is appropriately set such that a high-concentration doped region 217 is formed in the third region 210C of the semiconductor substrate 210 near an upper surface of the semiconductor substrate 210, and the high-concentration doped region 215 is formed at a middle portion of the semiconductor substrate 210 in the second region 210B. After the high-concentration doped regions 215 and 217 are formed, the silicon oxide layer 213 is removed to expose the high-concentration doped region 217 formed in the third region 210C of the semiconductor substrate 210.

Figure 5C:
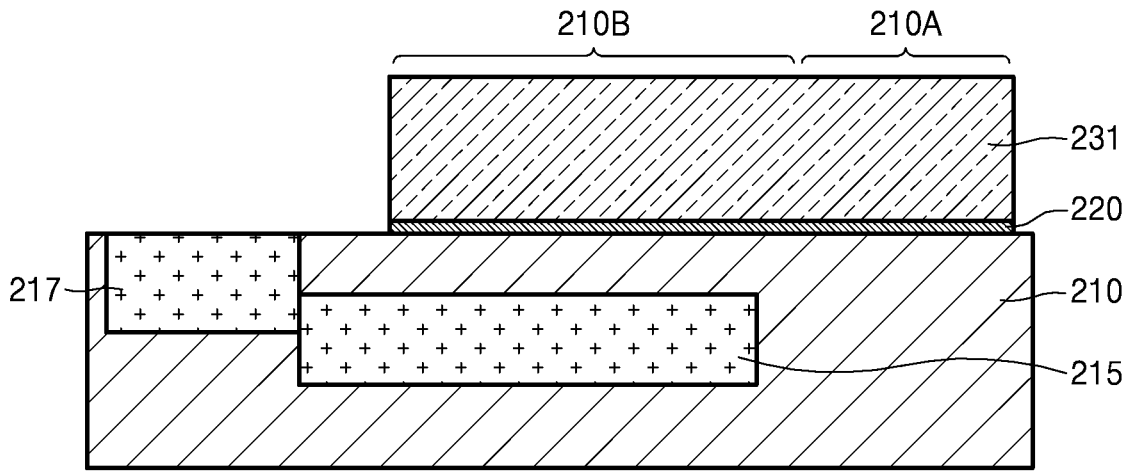

Referring to FIG. 5C, graphene is transferred onto the first and second regions 210A and 210B of the semiconductor substrate 210 to form the graphene layer 220, and a metal layer 231 is formed on the graphene layer 220. The metal layer 131 may be formed by depositing metal, such as Au, Ni, Pt, Al, Cr, alloys thereof or the like.

Figure 5D:
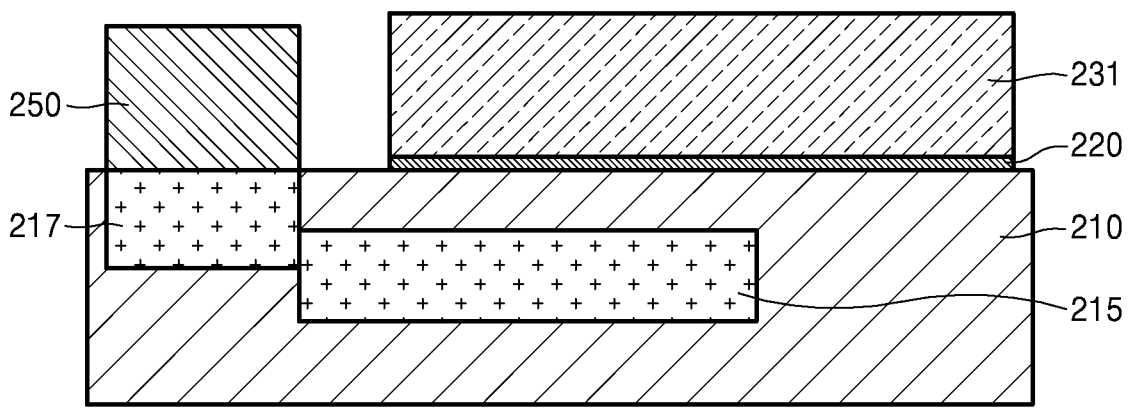

Referring to FIG. 5D, a third electrode 250 is formed on the exposed portion of the high-concentration doped region 217 in the third region 210C of the semiconductor substrate 210. The third electrode 250 may be formed by depositing metal or polysilicon on the exposed portion of the high-concentration doped region 217.

Figure 5E:
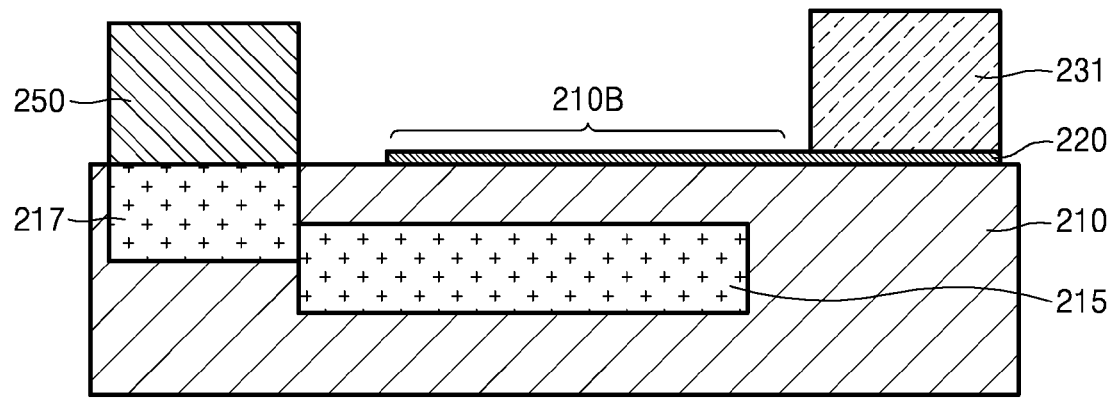

Referring to FIG. 5E, the portion of the metal layer 231 in the second region 210B is removed to expose the graphene layer 220 in the second region 210B. The remaining portion of the metal layer 231 constitutes the first electrode 230.

Figure 5F:
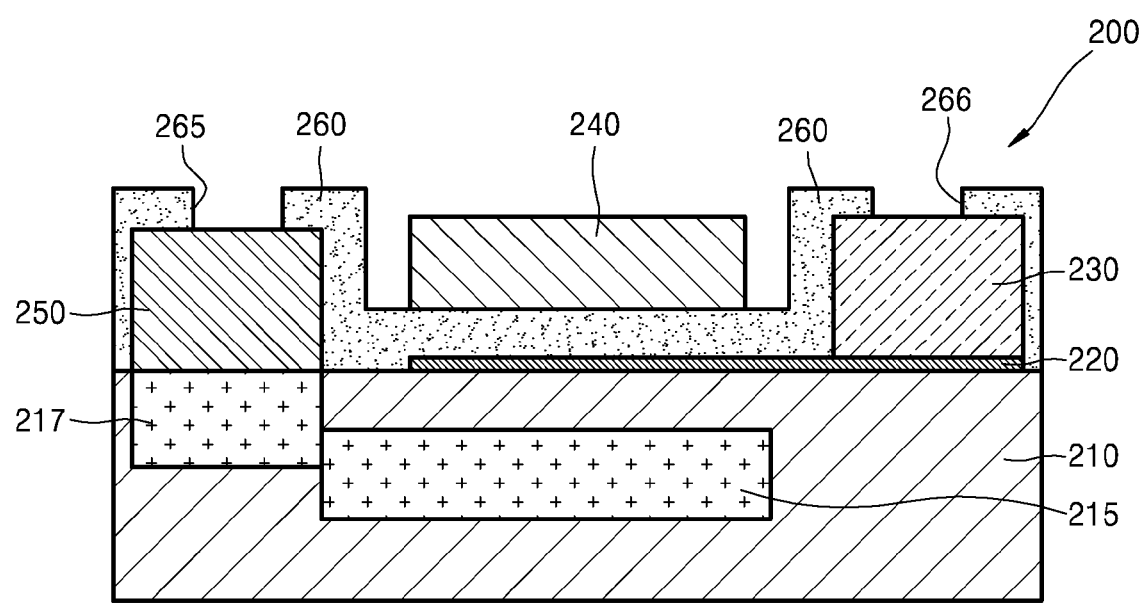

Referring to FIG. 5F, a gate insulating layer 260 is formed on the semiconductor substrate 210 including the first electrode 230, the graphene layer 220, and the third electrode 250. A second electrode 240 is formed on the gate insulating layer 260 between the first electrode 230 and the third electrode 250. Then portions of the gate insulating layer 260 corresponding to upper parts of the first electrode 230 and the third electrode 250 are etched to form holes 265 and 266 exposing upper surfaces of the first electrode 230 and the third electrode 250, respectively.

Graphene transistors according to one or more example embodiments are examples of graphene devices having a graphene Schottky diode structure. It would be understood by one of ordinary skill in the art that the graphene transistor according to one or more example embodiments may be applied to a logic circuit, a memory circuit, a pixel circuit of a display, and the like.

As described above, in a graphene device according to example embodiments, an insulating layer, for example, an oxide layer of a source electrode (or a drain electrode) is removed (or alternatively omitted) so that graphene may be directly grown on or transferred onto a flat or substantially flat surface. Also, in a graphene device according to one or more example embodiments, a high-concentration doped region is formed inside a semiconductor substrate to reduce resistance of a carrier flowing into the semiconductor substrate relative to a case in which a semiconductor substrate, for example, a silicon substrate according to the related art is used.

It should be understood that example embodiments described therein should be considered in a descriptive sense only and not for purposes of limitation. Descriptions of features or aspects within each example embodiment should typically be considered as available for other similar features or aspects in other example embodiments.

What is claimed is:

1. A graphene device comprising:
 a semiconductor substrate having a first region and a second region;
 a graphene layer on the first region, but not on the second region of the semiconductor substrate;
 a first electrode on a first portion of the graphene layer;
 a second electrode on a second portion of the graphene layer;
 an insulating layer between the graphene layer and the second electrode; and
 a third electrode directly on the semiconductor substrate, and entirely within the second region of the semiconductor substrate; wherein
 the semiconductor substrate has a tunable Schottky barrier formed by junction of the graphene layer and the semiconductor substrate,
 the first portion of the graphene layer is on the first region of the semiconductor substrate, and
 the first and second regions of the semiconductor substrate are semiconductor regions having semiconductive properties.

2. The graphene device of claim 1, wherein the graphene layer directly contacts the semiconductor substrate.

3. The graphene device of claim 1, wherein the first electrode directly contacts the graphene layer.

4. The graphene device of claim 1, wherein a surface of the first region of the semiconductor substrate is flat.

5. The graphene device of claim 1, wherein the first electrode is a source electrode, the second electrode is a gate electrode, and the third electrode is a drain electrode.

6. The graphene device of claim 1, wherein the semiconductor substrate has a carrier concentration of between about $10^{15}$ and about $10^{17}$ cm$^{-1}$, inclusive.

7. The graphene device of claim 1, further comprising:
 a high-concentration doped region in the semiconductor substrate, the high-concentration doped region being doped with impurities at a higher carrier concentration than a carrier concentration of the semiconductor substrate.

8. The graphene device of claim 7, wherein the high-concentration doped region is positioned in a lower part of the second region of the semiconductor substrate and in a third region of the semiconductor substrate, the third region being between the first and second regions of the semiconductor substrate.

9. The graphene device of claim 8, wherein the third electrode electrically contacts the high-concentration doped region through a hole in the third region of the semiconductor substrate.

10. The graphene device of claim 7, wherein the high-concentration doped region has a carrier concentration of between about $10^{18}$ and about $10^{20}$ cm$^{-1}$, inclusive.

11. The graphene device of claim 7, wherein a conductivity type of impurities doped into the semiconductor substrate and a conductivity type of the impurities doped into the high-concentration doped region are the same.

12. The graphene device of claim 7, wherein an upper surface of the high-concentration doped region is exposed and electrically contacts the third electrode.

13. The graphene device of claim 1, wherein the first electrode includes at least one of gold, nickel, platinum, aluminum, and chromium.

14. The graphene device of claim 1, wherein the second and third electrodes include metal or polysilicon.

15. The graphene device of claim 1, wherein the semiconductor substrate is formed of one of silicon, germanium, silicon-germanium, III-V-group semiconductor, and II-VI-group semiconductor.

16. The graphene device of claim 1, wherein the tunable Schottky barrier varies according to a voltage applied to the second electrode.

17. The graphene device of claim 1, wherein the tunable Schottky barrier decreases in response to a voltage applied to the second electrode.

18. A graphene device comprising:
 a semiconductor substrate;
 a graphene layer directly on a first region of the semiconductor substrate;
 a first electrode on a first portion of the graphene layer, a junction between the graphene layer and the semiconductor substrate forming a Schottky barrier of the semiconductor substrate;
 a second electrode on a second portion of the graphene layer;
 an insulating layer between the graphene layer and the second electrode; and
 a third electrode on a second region of the semiconductor substrate, wherein
 an entirety of the third electrode is directly on the semiconductor substrate,
 the first and second regions of the semiconductor substrate are semiconductor regions having semiconductive properties, and
 the first portion of the graphene layer is on the first region of the semiconductor substrate.

19. The graphene device of claim 18, wherein the first electrode directly contacts the graphene layer.

20. The graphene device of claim 18, wherein a surface of the first region of the semiconductor substrate is flat.

21. The graphene device of claim 18, wherein the Schottky barrier is a tunable Schottky barrier.

22. The graphene device of claim 18, wherein the Schottky barrier varies according to a voltage applied to the second electrode.

23. The graphene device of claim 18, further comprising:
 a high-concentration doped region in the semiconductor substrate, the high-concentration doped region being doped with impurities at a higher carrier concentration than a carrier concentration of the semiconductor substrate.

24. A graphene device comprising:
 a semiconductor substrate;
 a graphene layer on a flat surface of a first region of the semiconductor substrate;
 a first electrode on a first portion of the graphene layer, a junction between the graphene layer and the semiconductor substrate forming a Schottky barrier of the semiconductor substrate;
 a second electrode on a second portion of the graphene layer;
 an insulating layer between the graphene layer and the second electrode; and
 a third electrode on a second region of the semiconductor substrate, wherein
 an entirety of the third electrode is on the semiconductor substrate without an intervening layer,
 the first and second regions of the semiconductor substrate are semiconductor regions having semiconductive properties, and the first portion of the graphene layer is on the first region of the semiconductor substrate.

25. The graphene device of claim 24, the Schottky barrier varies according to a voltage applied to the second electrode.

26. The graphene device of claim 24, wherein the Schottky barrier is a tunable Schottky barrier.

27. The graphene device of claim 24, further comprising:
a high-concentration doped region in the semiconductor substrate, the high-concentration doped region being doped with impurities at a higher carrier concentration than a carrier concentration of the semiconductor substrate.

* * * * *